United States Patent [19]
Yamaguchi

[11] Patent Number: 6,067,632
[45] Date of Patent: May 23, 2000

[54] CLOCK-SYNCHRONIZED MEMORY DEVICE AND THE SCHEDULER THEREOF

[75] Inventor: Shusaku Yamaguchi, Kawasaki, Japan

[73] Assignee: Fujitsu Limited, Kawasaki, Japan

[21] Appl. No.: 09/116,249

[22] Filed: Jul. 16, 1998

[30] Foreign Application Priority Data

Jan. 6, 1998 [JP] Japan .................................. 10-000624

[51] Int. Cl.[7] .............................. G06F 1/04; G06F 12/00
[52] U.S. Cl. ........................................... 713/600; 711/105
[58] Field of Search ........................... 713/600; 711/100, 711/101, 104, 105, 154

[56] References Cited

U.S. PATENT DOCUMENTS

| | | | |
|---|---|---|---|
| 4,750,154 | 6/1988 | Lefsky et al. ........................ | 711/108 X |
| 5,414,811 | 5/1995 | Parulski et al. .......................... | 345/501 |
| 5,572,660 | 11/1996 | Jones ........................................... | 714/6 |
| 5,729,152 | 3/1998 | Leung et al. ............................... | 326/21 |
| 5,748,551 | 5/1998 | Ryan et al. ........................ | 365/230.06 |
| 5,774,739 | 6/1998 | Angle et al. ............................... | 712/34 |
| 5,835,745 | 11/1998 | Sager et al. ............................... | 712/215 |

*Primary Examiner*—Thomas M. Heckler
*Attorney, Agent, or Firm*—Arent Fox Kintner Plotkin & Kahn PLLC

[57] ABSTRACT

The present invention provides inside a scheduler a shift register, which performs a shift operation in synch with an external clock, or a clock generated thereby. Then, for example, when controlling latency from the supply of a command until the start of a column operation, at the time the command is supplied, a column access signal is stored in a shift register location, which corresponds to its latency. Because the shift register performs a shift operation in synch with a clock, a column access signal is outputted subsequent to a number of clock pulses, which correspond to its latency. A column control circuit, in response to the timing at which this column access signal is outputted, acquires a column address and other data required for a column circuitry operation, and starts a column circuitry operation. A configuration such as this simplifies the operation of the scheduler. In the above-described shift register, setting an internal operation command signal, which starts a prescribed internal operation, makes it possible to readily manage latency up until the start of an arbitrary internal operation.

14 Claims, 12 Drawing Sheets

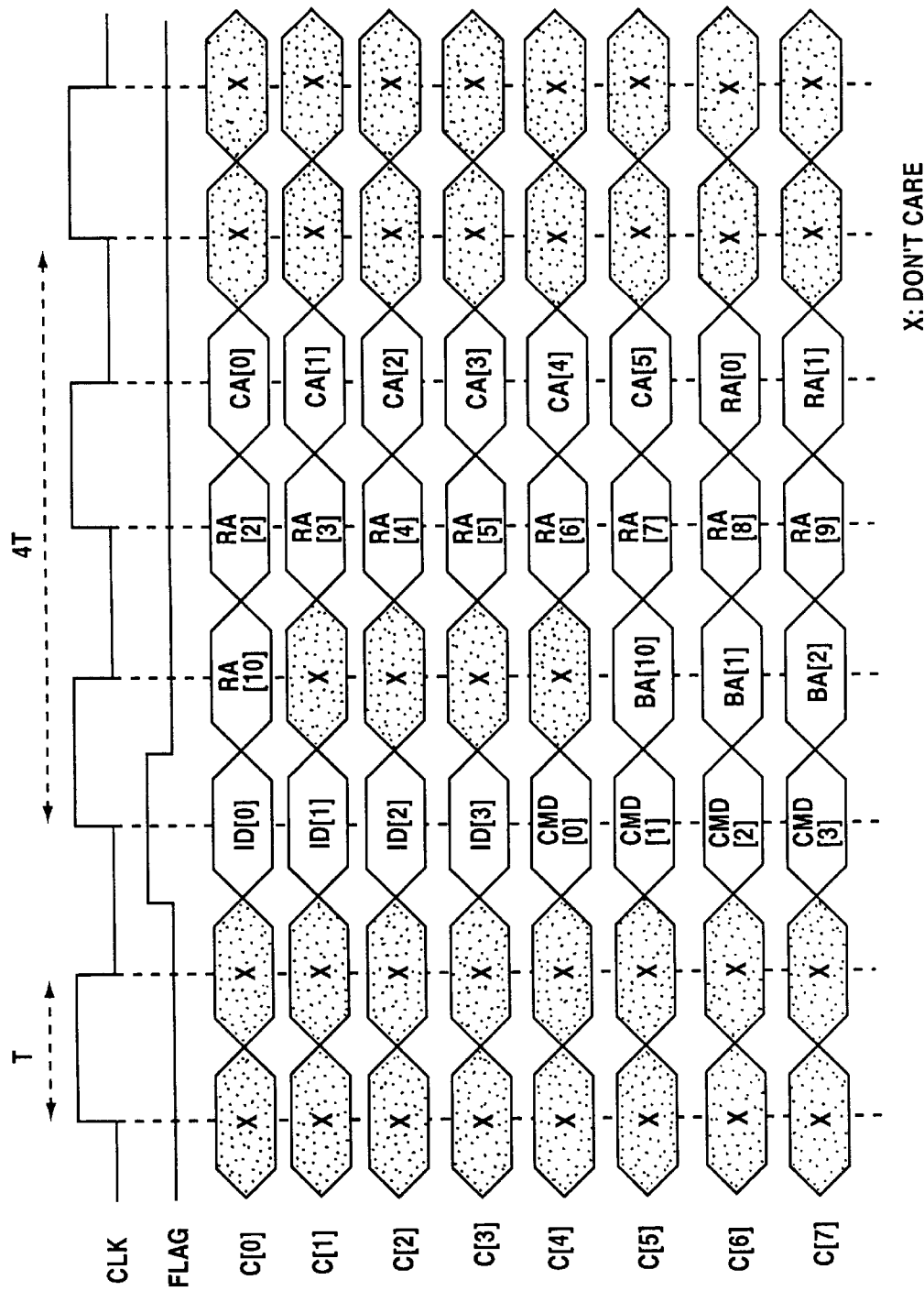

FIG.2
TRUTH TABLE FOR COMMAND

| CMD[0] | CMD[1] | CMD[2] | COMMAND | CMD[3] | OPERATION |
|---|---|---|---|---|---|
| 1 | 0 | 0 | BANK-READ | 0 | ROW ACTIVE => COL.READ |
|   |   |   |   | 1 | ROW ACTIVE => COL.READ => PRECHARGE |
| 1 | 0 | 1 | BANK-WRITE | 0 | ROW ACTIVE => COL.WRITE |
|   |   |   |   | 1 | ROW ACTIVE => COL.WRITE => PRECHARGE |
| 0 | 0 | 0 | ROW-ACTIVE | 0 | ROW ACTIVE |
| 0 | 0 | 1 | PRECHARGE | 0 | PRECHARGE (ONLY ONE BANK) |
|   |   |   |   | 1 | PRECHARGE (ALL BANK) |
| 1 | 1 | 0 | PAGE-READ | 0 | COL.READ |
|   |   |   |   | 1 | COL.READ => PRECHARGE |
| 1 | 1 | 1 | PAGE-WRITE | 0 | COL.WRITE |
|   |   |   |   | 1 | COL.WRITE => PRECHARGE |
| 0 | 1 | 0 | REFRESH | 0 | ROW ACTIVE => PRECHARGE |

EXAMPLE OF LATENCY OF EACH COMMAND

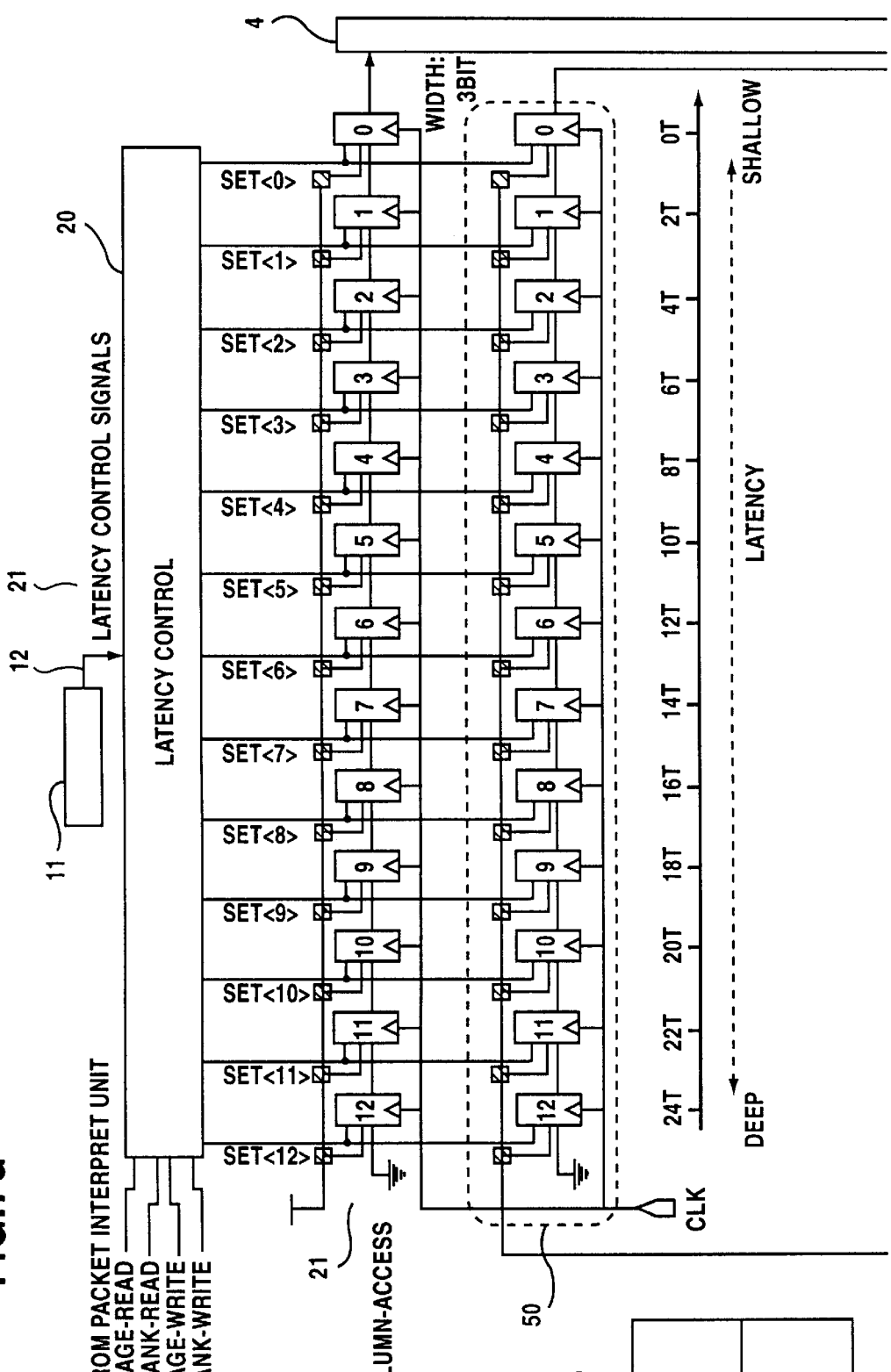

SHIFT REGISTERS

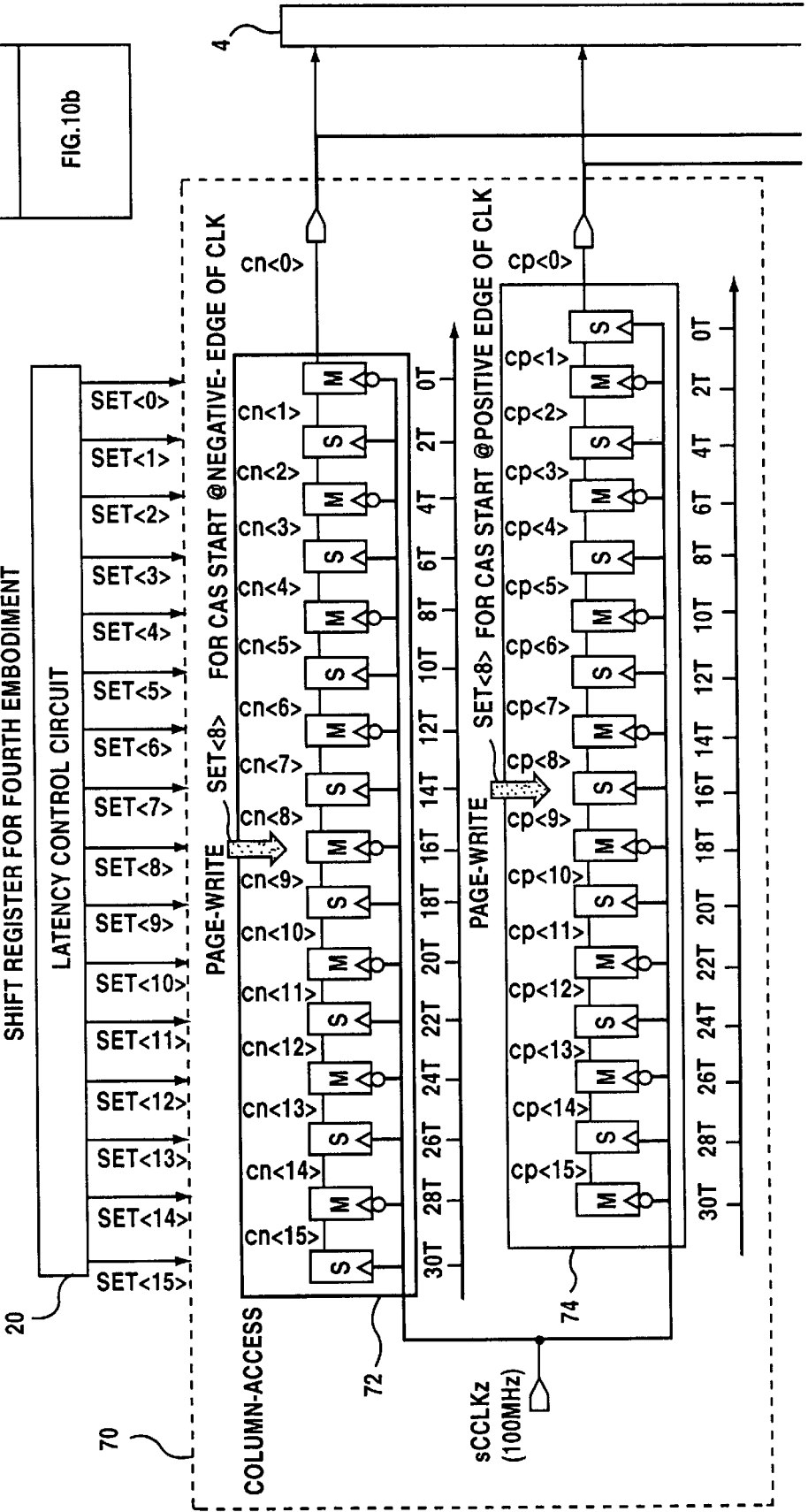

CLOCK-SYNCHRONIZED MEMORY DEVICE AND THE SCHEDULER THEREOF

BACKGROUND OF THE INVENTION

The present invention relates to a memory device, whereby a command, row address, bank address and column address are provided in a packet format from a memory controller, and more particularly to a clock-synchronized memory device, which comprises a scheduler, which makes it possible to control latency from the supply of a command to the start of an internal circuit operation, such as the start of a column side operation.

With Synchronous Dynamic Random Access Memory (SDRAM), which has come into widespread use recently as highspeed memory, a command and address or data are supplied in synch with an external clock, and after a prescribed interval, read data is output in synch with an external clock. For such SDRAM, a command input pin, which inputs a command signal, and an address input pin, which inputs a row address or column address, are provided separately. And then, a command signal and an address signal required for that command are provided simultaneously.

Principal commands include an Active command, which drives a word line corresponding to a row address, a Read command, which reads data from a column corresponding to a column address, a Write command, which writes data to a column corresponding to a column address, a Precharge command, which closes a word line and precharges a bit line, and a Refresh command, which performs refresh. A memory controller, which controls a memory device, performs various controls by supplying these commands to the memory device together with an address and data subordinate thereto.

For example, when reading data from memory, first an Active command is supplied together with a row address, then, after a prescribed interval (latency), a Read command is supplied together with a column address, and finally, a Precharge command is supplied. Further, in the burst mode, whereby a plurality of bits are read out consecutively, after an Active command is supplied together with a row address, read commands are supplied sequentially at a prescribed timing with a continuously changing column address. Further, when writing data to memory, an active command is supplied together with a row address, and after a prescribed interval (latency), a write command is supplied together with a column address and write data.

However, the above-described commands are divided into a command that requests a row side operation, and a command that requests a column side operation, and, in accordance with the operating mode, a memory controller must supply a plurality of these commands to the memory device based on a standardized latency. In particular, in accordance with the internal operation of the memory device, a column side operation must be started subsequent to a prescribed latency from the start of a row side operation, which tends to increase the resulting burden of control placed on the memory controller.

Conversely, to lessen the control burden of the above-described memory controller, a SyncLink DRAM has been newly proposed. The complete details thereof have yet to be clarified, but the basic specifications are such that a memory controller groups a command signal, a row address signal, a column address signal, awrite signal and a bank address signal, which is a kind of row address, into a packet and supplies this packet to a memory device in synch with an external clock. Column control for latency management need not be performed as with the above-described SDRAM. Consequently, the supply of the above-described packetized signal to 8 common input pins by time sharing it 4 times is being studied.

The above-described SyncLink DRAM can lessen the load on the memory controller, but on the memory device side, an internal operation must be controlled at a prescribed latency for a command, and a row address and a column address, which are provided at the same time. For example, for a read or write operation, whereby a command, and a row address and a column address are supplied simultaneously, subsequent to the supply of a command, latency must be controlled until the start of the column side operation subsequent to the end of the row side operation. Further, as with the burst mode in an SDRAM, it is also necessary to support a Read command and Write command, which are capable of consecutively accessing data of different column addresses at the same row address. In the case of this type of command, the latency from the supply of a command until the start of a column operation is short, unlike that of the above-described read/write operation. Thus, latency must be capable of changing in accordance with the supplied command.

Furthermore, there are also cases wherein latency is ependent on the capabilities (operating speed) of the memory device and the frequency of the clock by which it is driven. That is, even a mode register, by which the initial value of a memory device is set, must be able to change latency, which corresponds to various operation commands. Further, even in operations other than the column internal circuitry operations described above, latency control must be performed internally from the timing at which the command is supplied until a prescribed internal operation.

Therefore, a scheduler, which manages the schedule of an internal operation relative to the above-described request packet input is required inside a memory device. However, at present, a proposal for the above-described scheduler has yet to be made. And for large capacity, highspeed memory devices, suppressing current consumption is unavoidable. When providing such a scheduler, the suppression of current consumption must be taken into consideration.

Accordingly, an object of the present invention is to provide a clock-synchronized memory device like a SyncLink DRAM that solves for the above-described problems, and a memory device that comprises an appropriate scheduler.

Furthermore, another object of the present invention is to provide a memory device, which comprises a scheduler, which is small in size and suppresses current consumption.

Furthermore, another object of the present invention is to provide a scheduler, which is capable of being used in a SyncLink DRAM.

SUMMARY OF THE INVENTION

The present invention provides inside a scheduler a shift register, which performs a shift operation in synch with an external clock, or a clock generated thereby. Then, for example, when controlling latency from the supply of a command until the start of a column operation, at the time the command is supplied, a column access signal is stored in a shift register location, which corresponds to its latency. Because the shift register performs a shift operation in synch with a clock, a column access signal is outputted subsequent to a number of clock pulses, which correspond to its latency. A column control circuit, in response to the timing at which this column access signal is outputted, acquires a column address and other data required for a column circuitry operation, and starts a column circuitry operation. A configuration such as this simplifies the operation of the scheduler. In the above-described shift register, setting an internal operation command signal, which starts a prescribed internal operation, makes it possible to readily manage latency up until the start of an arbitrary internal operation.

Further, the scheduler of the present invention stores a column access signal and other internal operation command signals in a prescribed location in the above-described shift register in accordance with the latency of each operation mode which is set in a mode register by a register set command furnished from the memory controller at the start of memory device operation. That is, in accordance with the present invention, it is possible to provide a scheduler, which is capable of flexibly changing the location that should be set first inside the shift register, and which can flexibly cope with the optimum latency for a memory device or a system.

In addition to the shift register, in which the above-described internal operation command signal is stored, the scheduler of the present invention also comprises a similar shift register for data required for internal operations, such as a column address, bank address, and a read/write bit. And by setting the above-described required data in the same latency location as the shift register in which an internal operation command signal is stored, after the prescribed latency, this required data can also be fetched at the same time as the above-described internal operation command signal.

Further, the scheduler of the present invention stores data required for an internal operation in sequence inside a plurality of registers, and sets the address data of these registers in aprescribed location of the shift register. Then, when the above-described internal operation command signal is output from a shift register after the prescribed latency, it is also possible to fetch the data required for an internal operation from the register that corresponds to the address data of the registers, which are output at the same time as the internal operation command signal.

To achieve the above-described objects, the present invention is a scheduler, which generates an internal operation command signal that directs the operation of an internal circuit subsequent to latency, which corresponds to a supplied command or an initial value, the scheduler comprising:

a shift register, which stores the above-described internal operation command signal, and performs shift operations in synch with a clock; and a latency control circuit, which stores the internal operation command signal in a register of the shift register at a location that corresponds to the latency, wherein the internal operation command signal, which is output from the final stage of the shift register subsequent to a number of clock pulses corresponding to the latency is supplied to the internal circuitry.

In accordance with the present invention described above, the latency control circuit simply selects the register of a location corresponding to latency that accords with either a command or an initial value, and stores an internal operation command signal in that register, and the scheduler can output the internal operation command signal subsequent to a number of clock pulses corresponding to the latency. Therefore, changes in latency can be dealt with flexibly, and pipeline operations are also possible.

To achieve the above-described objects, a second present invention is a memory device, to which a command, together with a row address and a column address is supplied in synch with an external clock, this memory device comprising:

a memory cell array;

internal column circuitry, which corresponds to the memory cell array, and operates in response to the column address; and a scheduler, which supplies to the internal column circuitry a column access signal so as to start an operation of the internal column circuitry, subsequent to latency corresponding to the command after the command is supplied.

In accordance with the present invention described above, a memory controller, which controls the memory device, can simply simultaneously furnish a command, and a row address and a column address, thus lessening the control burden of the memory device.

Furthermore, in the second present invention described above, the scheduler further comprises: a shift register, which stores the column access signal, and shifts this column access signal in synch with a clock; and a latency control circuit, which stores the column access signal in a register of the shift register at a location, which corresponds to the latency, wherein a column access signal, which is outputted from the final stage of the shift register subsequent to a number of clock pulses corresponding to the latency is supplied to the column internal circuitry.

Furthermore, to achieve the objects, the present invention is a memory device, which, in synch with an external clock, is supplied with a request packet signal, including a command, bank address and column address, the memory device comprising:

a plurality of memory banks, each including a memory cell array;

internal column circuitry, which corresponds to each of the memory banks, operates in response to the column address and bank address, and effectuates access to a memory bank corresponding to the bank address; and a scheduler, which supplies to the internal column circuitry a column access signal so as to start an operation of the internal column circuitry, together with the above-described bank address and column address, subsequent to the latency corresponding to the command after being supplied with the command, wherein, it is possible to access to a different memory bank corresponding to the bank address in response to a request packet signal including the bank address.

The memory controller, which controls the memory device, can enable access to memory of a different row address by changing the bank address and providing in succession Page-Read or Page-Write commands.

BRIEF DESCRIPTION OF THE DRAWINGS

FIG. 1 is a diagram showing an example of a request packet format for a memory device of an embodiment of the present invention;

FIG. 2 is a diagram showing an example of a truth table of commands for this embodiment;

DESCRIPTION OF THE PREFERRED EMBODIMENTS

Figure 3:
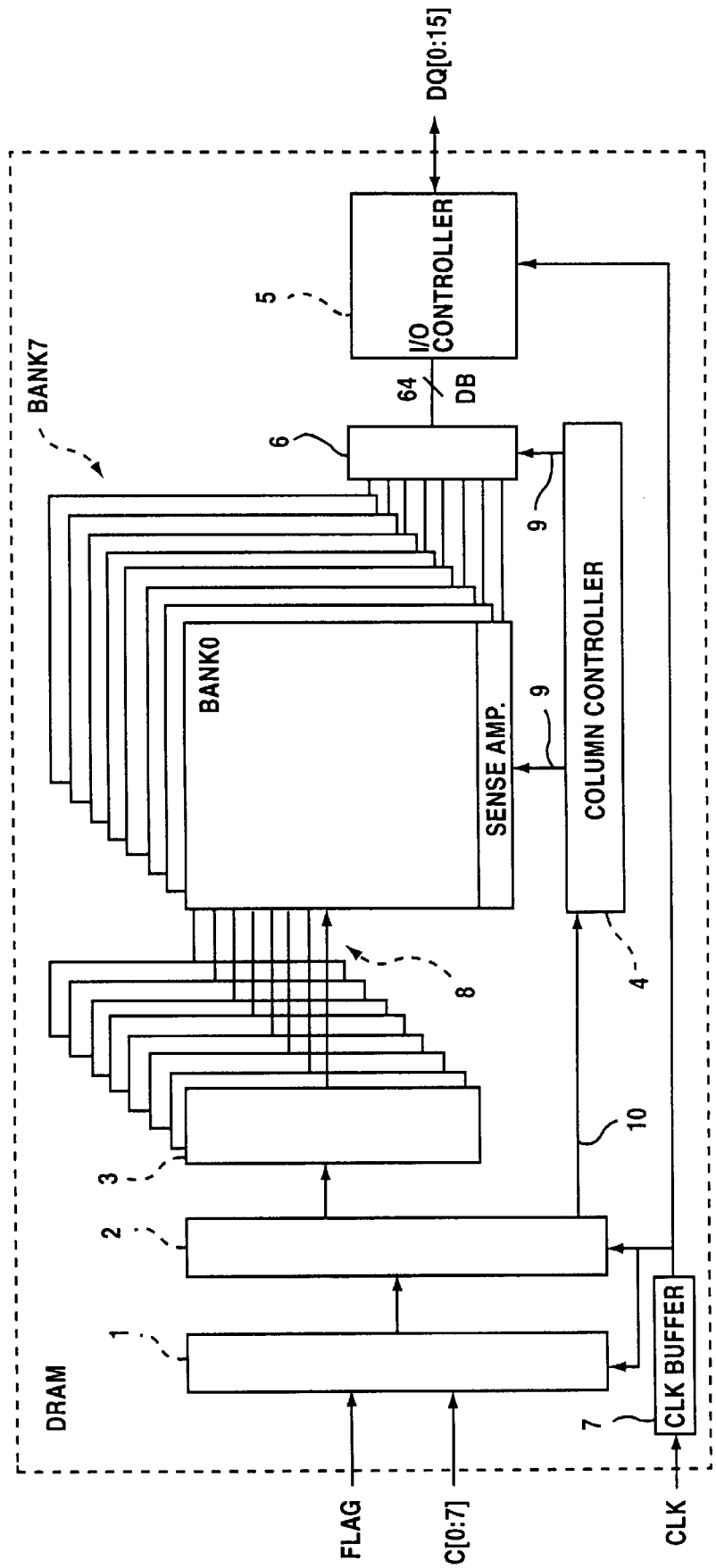
FIG. 3 is a block diagram showing the overall configuration of the memory device of this embodiment.

The embodiments of the present invention are explained below with reference to the figures. However, the technological scope of the present invention is not limited to these embodiments.

FIG. 1 is a diagram showing an example of a request packet format for a memory device of an embodiment of the present invention. As shown in FIG. 1, packet data is supplied to input pins C0–C7 in synch with both the rising edge (or positive edge) and falling edge (or negative edge) of an external clock CLK by time sharing this data 4 times. In this case, so that the memory device side can determine on which rising edge of the external clock valid packet data is to be supplied, the memory controller supplies a flag signal FLAG. The flag signal FLG is a signal that indicates the timing of packet data start, and becomes H level at the first rising edge of the external clock CLK when valid packet data is supplied.

Input pins C0–C7 are multiplexed input pins, and input signals supplied serially to these input pins are captured into memory serially and converted to parallel.

Memory device ID data ID0–ID3 of the packet data are the ID addresses of a plurality of memory devices connected to the memory controller. The memory controller supplies the ID of the memory device targeted for control, and on the memory device side, the ID data in the packet is compared against a memory device's own ID stored in an ID register in memory, and a determination is made as to whether the request packet was issued for itself or for another memory device.

Data, which accords with a variety of commands described below, is provided in a 4-bit command CMD0–CMD3. Other packet data includes a 3-bit bank address BA0–BA2, an 11-bit row address RA0–RA10, and a 6-bit column address CA0–CA5. Needless to say, the number of bits in these addresses will differ according to the capacity and configuration within the memory device.

Also, in this embodiment, the premise is that request packet data starts from the rising edge of an external clock CLK.

FIG. 2 is a diagram showing an example of a truth table for commands in this embodiment. FIG. 2 provides examples of some of the commands considered necessary to describe this embodiment. Bank-Read is a command in which a command CMD0–CMD2 consists of (100), and it is a read access command that starts from row circuitry activation. That is, the memory device issues an Active command internally, activates row circuitry, and drives a word line in accordance with a row address. Thereafter, the memory device issues a Read command (column access signal for readout) internally, activates column circuitry, and reads select column data in accordance with a column address. In the case of Bank-Read, when command CMD3 is 0, a column read operation is performed subsequent to a Row-Active operation. Conversely, when command CMD3 is 1, a column read operation is performed subsequent to a Row-Active operation, and finally, precharge is performed. Either the operation with precharge or without precharge are provided so that write or page-mode read can be performed for memory of the same address after readout.

Bank-Write is a command in which command CMD0–CMD2 consists of (101), and similar to Bank-Read, it is a write access command that starts from row circuitry activation. In the case of Bank-Write, when command CMD3 is 0, a column write operation is performed subsequentto aRow-Activeoperation. Conversely, when command CMD3 is 1, a column write operation is performed subsequent to a Row-Active operation, and finally, precharge is performed.

Row-Active is a command that only activates a row. Precharge is a command which performs a precharge operation, whereby a word line is deactivated and memory cell data is held, and a bit line is precharged to a prescribed voltage level. Page-Read and Page-write are commands that only activate column circuitry, and perform read and write operations, respectively. These commands are appropriate for burst mode operations in SDRAM. And Refresh is a command that deactivates a word line, and performs a precharge operation after a delay equivalent to row address latency (tRAS) subsequent to activation of a row.

As described above, of the commands shown in FIG. 2, the commands that require the start of a column operation subsequent to a prescribed latency from command input are Bank-Read, Bank-Write, Page-Read and Page-Write. This is explained in more detail below.

FIG. 3 is a block diagram showing the overall configuration of the memory device of this embodiment. This memory device comprises a packet decoder 1, a scheduler 2, 8 memory banks Bank0–7, the row control circuits therefor 3, a column control circuit 4, a data bus selector 6, and an I/O controller 5. Inside the memory banks Bank0–7 are provided a memory cell array, row decoder, row driver, and column decoder, which are not shown, and a sense amp. Arow control signal 8 containing a row address is supplied from a row control circuit 3 to these memory banks, and a column control signal 9 containing a column address is supplied from the column control circuit 4 to these memory banks.

Therefore, a row control circuit 3, and a row decoder and row driver inside a memory bank correspond to internal row circuitry. Further, the column control circuit 4, column decoder inside a memory bank and the DB selector 6 correspond to a internal column circuitry.

The packet decoder 1 latches a flag signal FLG and an 8-bit input pin signal C0:7 at the timing of both edges of an external clock CLK, uses the flag signal FLG to determine whether or not a valid request packet was issued, determines whether the device ID inside the packet data shows its own ID, and also decodes a command CMD0:3. Then, in line with the results decoded by the packet decoder 1, the scheduler 2 sets the schedule of an operation required for the decoded command. More specifically, for example, it sets latency in accordance with the command and data set in a mode register.

When the commands are Bank-Read, Bank-Write and Row-Active, the row control circuit 3, which corresponds to the Bank specified by the bank address BA0:2 of the packet data, supplies a row control signals 8, such as the row address in the packet data, and activates the row side circuitry.

Further, when the command is Bank-Read, Bank-Write, Page-Read or Page-Write, because these are accompanied by a column access operation, the scheduler 2, subsequent to a prescribed latency from command input, supplies to the column control circuit 4 a column control signal 10, comprising a bank address BA0:2, a column address CA0:5 and other control data. The column control circuit 4 then activates a column at this timing, causing a read or write operation to be performed.

With a read operation, the I/O controller 5 transfers 64-bit data from a specified bank via the data bus selector 6, a parallel-serial converter (not shown) converts this data, and outputs 4-bit serial data to each of 16 input-output pins DQ0:15 in synch with both edges of an external clock CLK. And with a write operation, the I/O controller 5 latches each 4-bit serial data supplied to the input-output pins DQ0:15 in synch with both edges of an external clock CLK, and writes the 64-bit parallel data achieved via serial-parallel conversion to memory in a selected memory bank.

If we assume that the frequency of the external clock CLK is 200 MHz, in the above-described read operation and write operation, the data transfer rate between the input-output pins DQ and the memory controller becomes 400 MHz/sec/pin. However, an internal memory device operation using a serial-parallel converter or parallel-serial converter becomes 100 MHz (10 ns cycle).

The above-described memory device is supplied with a request packet containing a Bank-Read command, operates the internal row circuitry to drive a word line, and subsequent to a prescribed latency, operates the internal column circuitry to readmemory cell data. After that, it is supplied-with a request packet containing a Page-Read command for a different bank address, and can read data from amemory cell, which corresponds to the same column address, but which is in a different memory bank. Therefore, by using this Page-Read with changing the bank address, it becomes possible to access memory with a substantially different row address. Similarly, by supplying a Page-Write after a Bank-Write makes it possible to write consecutively to different memory banks.

Figure 4:
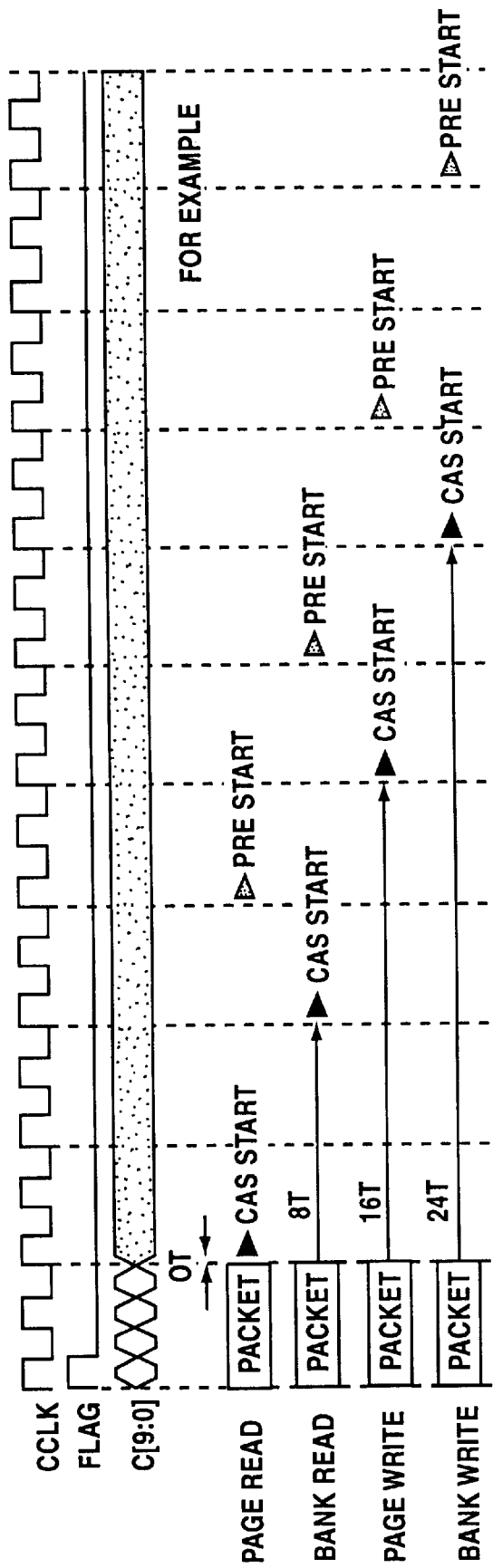
FIG. 4 is a diagram showing an example of latency from the supply of a command until column activation.

FIG. 4 is a diagram showing an example of latency from the supply of a command until column activation. The scheduler of the present invention is not limited to latency up until column activation, and can be used widely to control latency, which provides timing for all sorts of internal operations. One example of latency from the supply of a command until column activation is described below.

The latency depicted in FIG. 4 is, specifically, the latency from the end of the request packet until the activation of column circuitry. In FIG. 4, the start of column circuit activation is expressed as CASstart, and the start of a precharge operation is expressed as PREstart. Further, the half-wavelength of the external clock, the duration of an H level or the duration of an L level is called a tick T.

For example, because column circuit activation can be started instantly when the command is Page-Read, latency is 0 ticks (0T). Conversely, for Bank-Read, because it is necessary to drive a word line by first activating row circuitry, and to activate column circuitry only after memory data has been fully transferred to a bit line, latency is, for example, 8 ticks (8T). Furthermore, for Page-Write, write data must be latched as described above after decoding a packet command and ascertaining a write. Therefore, latency is 16 ticks (16T), for example. Then, for Bank-Write, because column circuitry is activated after latching write data and activating row circuitry, the latency thereof is a maximum of 24 ticks (24T), for example. The above-described latencies are strictly examples.

Figure 5:
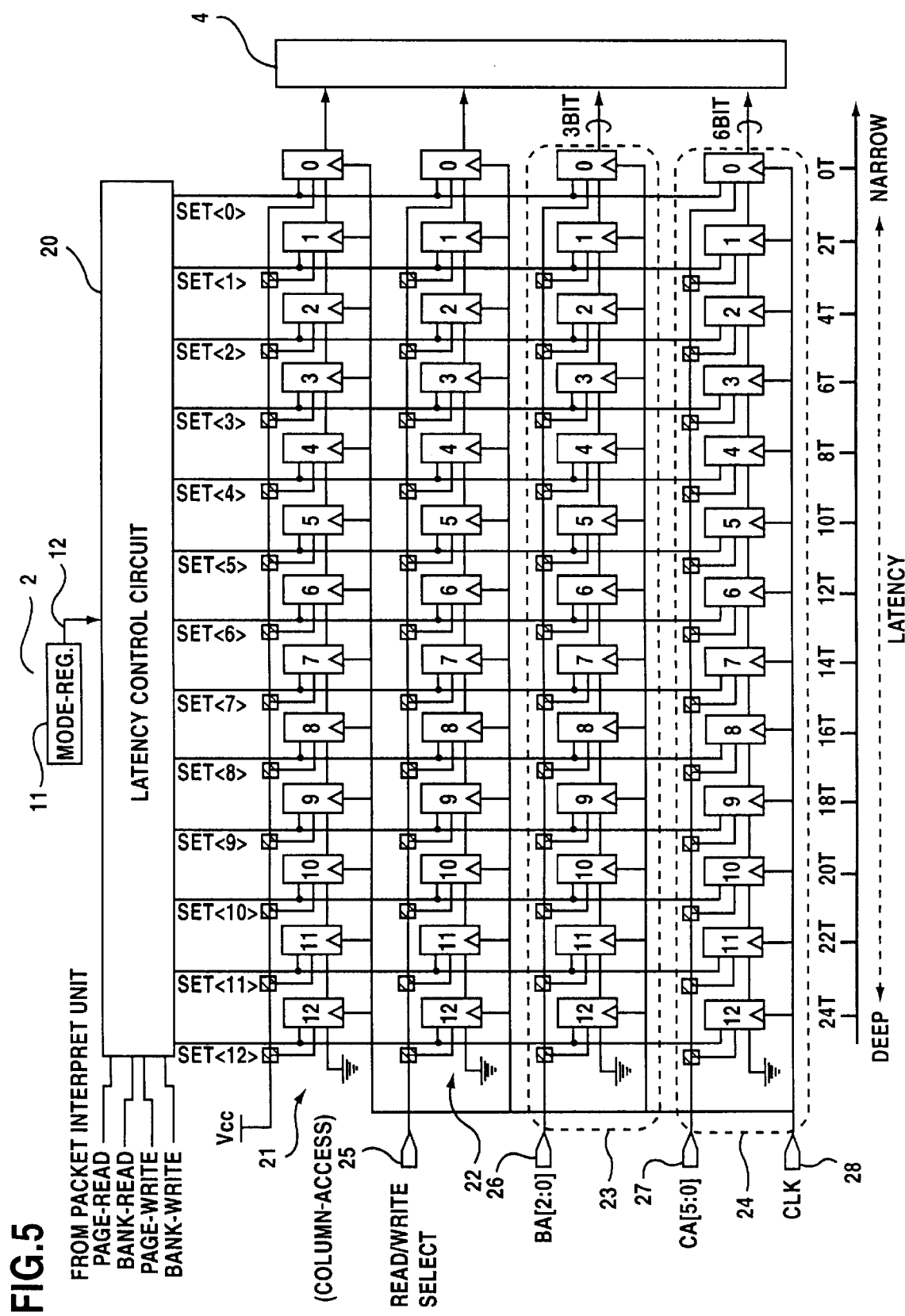
FIG. 5 is a diagram showing a scheduler of a first embodiment.

Latency, which differs for each command depicted in FIG. 4, is also dependent on the frequency of the external clock CLK and the speed of the memory device, respectively. Therefore, the length of latency for each of these commands is also set in accordance with the initial value set in a mode register to be described below. FIG. 5 is a diagram showing a scheduler of a first embodiment. This scheduler comprises a latency control circuit 20, which is supplied with a decoded command, i.e. Page-Read, Bank-Read, Page-Write, Bank-Write, from a packet decoder 1. This latency control circuit 20 is also supplied with a latency control signal 12 from a mode register 11. A latency control circuit 20 sets the optimum length of latency for each command based on the supplied command and latency control signal 12, and a latency set signal SET is output to a set pin SET<0>-SET<12>, which corresponds to that latency.

The scheduler also comprises 4 12-bit shift registers 21–24. An internal operation command signal that indicates column access is stored in shift register 21. Further, a read-write select signal is stored in shift register 22. A bank address BA0:2 is stored in shift register 23, and a column address CA0:5 is stored in shift register 24. Because a bank address is 3 bits, shift register 23 provides 3 sets of shift registers, and the output thereof is also 3 bits. Similarly, because a column address is 6 bits, shift register 24 provides 6 sets of shift registers, and the output thereof is also 6 bits.

That is, the above-described register 21 is a shift register, which stores a column access signal, and performs shift operations, and shift registers 22, 23, 24 are control data holding circuits.

When a set pin SET is H level, each register of these shift registers latches data corresponding thereto in synch with the edge of an internal clock 28. Further, when a set pin SET is L level, a register latches the previous stage data in synch with the internal clock 28, thereby shifting 1 bit at a time to the right. However, when a set pin SET is H level, shift register 21, which stores a column access signal, is connected to a power source Vcc so as to store H level. Further, the input pin of the first stage register, which is at the right end of all the shift registers, is connected to a ground, and latches an L level as previous stage data.

The output of final stage registers (the number 0 registers at the right side in the figure) of the above-described shift registers 21–24 is supplied to a column control circuit 4. The column control circuit 4, at a timing by which a column-access signal, which is an internal operation command signal, is supplied from the final stage of shift register 21, is supplied with a corresponding read/write select signal 25, bank address 26 and column address 27, and starts operation.

Now, let us assume that Bank-Write is consecutively supplied as the command. For Bank-Write, as shown in FIG. 4, column access latency is 24T. Therefore, the latency control circuit 20 latches a column access signal H level to the $12^{th}$ register of shift register 21 by outputting an H level to set pin SET <12>. Further, in response to the H level of set pin SET <12>, a read/write select signal 25 is latched to the $12^{th}$ register of shift register 22, a bank address BA is latched to the $12^{th}$ register of shift register 23, and a column address CA is latched to the $12^{th}$ register of shift register 24. Even when Bank-Write is supplied consecutively, each time the Bank-Write command packet ends, corresponding control data is latched to the $12^{th}$ register of a shift register.

Then, because these shift registers sequentially shift latched data to the right in synch with an edge of the clock clk, subsequent to the number of clock pulses (or subsequent to the number of ticks) set by the latency control circuit 20, the column control circuit 4 receives from the right-most register of shift register 21 an internal operation command signal, which directs column access. In response to this column access command signal, the column control circuit 4 starts activation of column circuitry using control data received simultaneously from other shift registers 22, 23, 24.

As described above, by storing a column access signal for a consecutively supplied Bank-Write mode in register 21 at a location corresponding to the latency, when this mode is supplied, the internal column circuitry can be controlled to perform pipeline operations.

Therefore, control is simple. At the point when a request packet containing a command is supplied, the latency control circuit 20 need only output a set pin signal of a location corresponding to the appropriate latency. Moreover, when latency differs in accordance with each command or with the latency control signal 12 from the modern register 11, this change can be dealt with flexibly by simply changing the location of the set pin.

In FIG. 5, because column access latency is 0T when the command is Page-Read, the $0^{th}$ set pin SET <0> is activated (H level), and data is latched by the $0^{th}$ register. Because latency is 8T when the command is Bank-Read, the $4^{th}$ set pin SET <4> is activated. Furthermore, because latency is 16T for Page-Write, the $8^{th}$ set pin SET <8> is activated.

Figure 6:
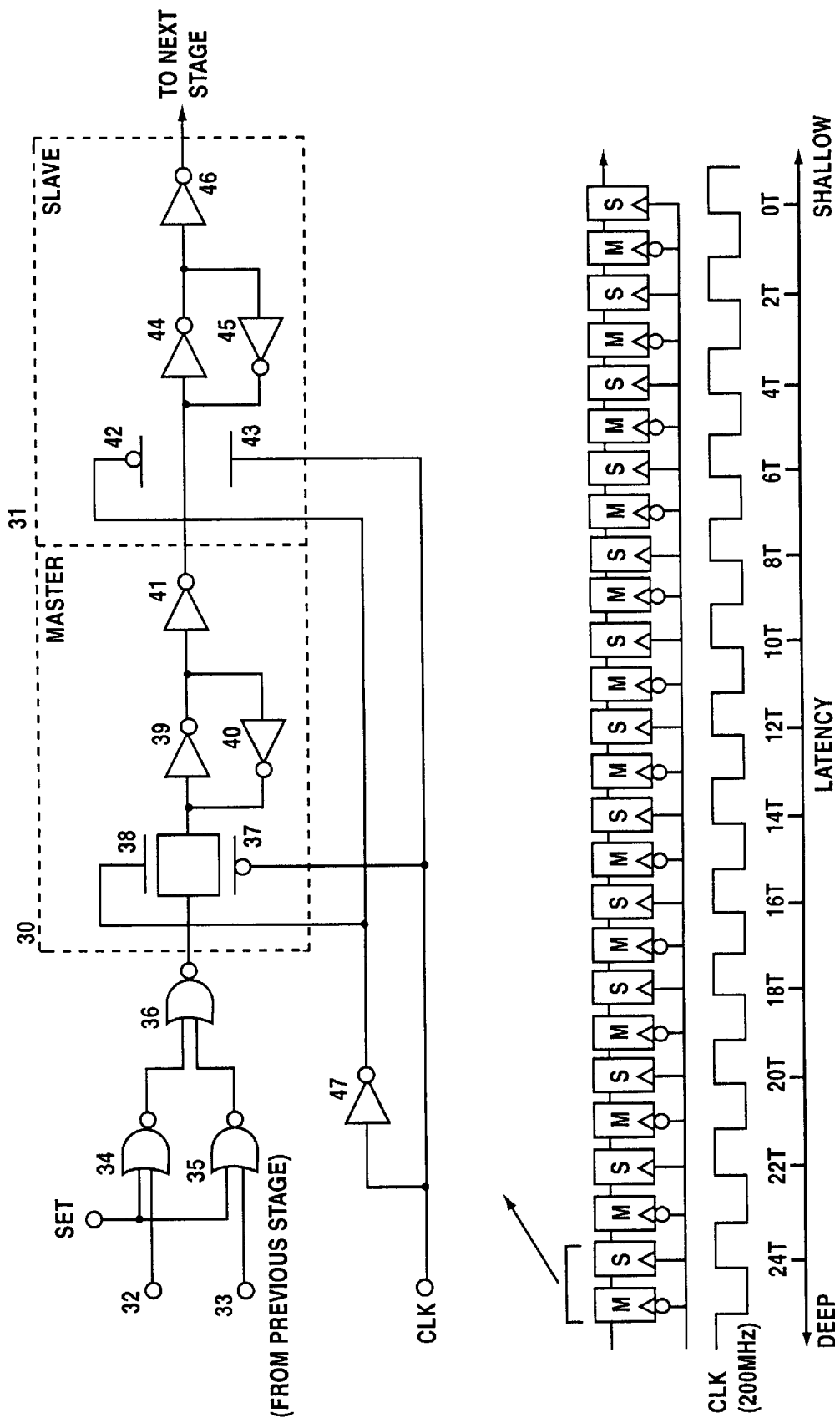
FIG. 6 is a circuit diagram showing an example of a shift register in a scheduler.

FIG. 6 is a circuit diagram showing an example of a shift register in a scheduler. As shown at the bottom of FIG. 6, the shift register in this example is configured by connected a master-slave flip-flop in series. The master flip-flop 30 accepts input and changes its output when the clock clk is L level, and holds this input data during the interval when the clock becomes H level. Further, the slave flip-flop 31 accepts input and changes its output when the clock clk is H level, and holds this input data during the interval when the clock becomes L level. Therefore, a shift register of the scheduler shown in FIG. 5 captures all external data input from the input of the master flip-flop 30 side, and all its output is outputted from the output of the slave flip-flop 31 side. As shown at the bottom of FIG. 6, with this configuration, latency can be controlled in units of 2 ticks (2T) of the clock clk.

The master flip-flop 30 of FIG. 6 comprises an input gate, comprising a P-channel transistor 37 and an N-channel transistor 38, which conduct when the clock clk is L level, a latch circuit comprising inverters 39, 40, and an inverter 41. Further, an input circuit, comprising a NAND gate 34 and NOR gates 35, 36, is provided on the input side of the master flip-flop 30, and either data from an external data pin 32, or data from a data pin 33 from the previous stage is latched by the master flip-flop 30 in accordance with a set signal SET during the interval when the clock clk is L level.

On the other hand, the slave flip-flop 31 comprises an input gate, comprising a P-channel transistor 42 and an N-channel transistor 43, which conduct when the clock clk is H level, a latch circuit comprising inverters 44, 45, and an inverter 46.

In the case of shift register 21 of FIG. 6, the external data pin 32 is connected to a power source Vcc, and is constantly supplied at H level. Further, the previous stage data pin 33 of the initial stage register is connected to a ground, and is supplied at L level.

[Second embodiment]

Figure 7B:
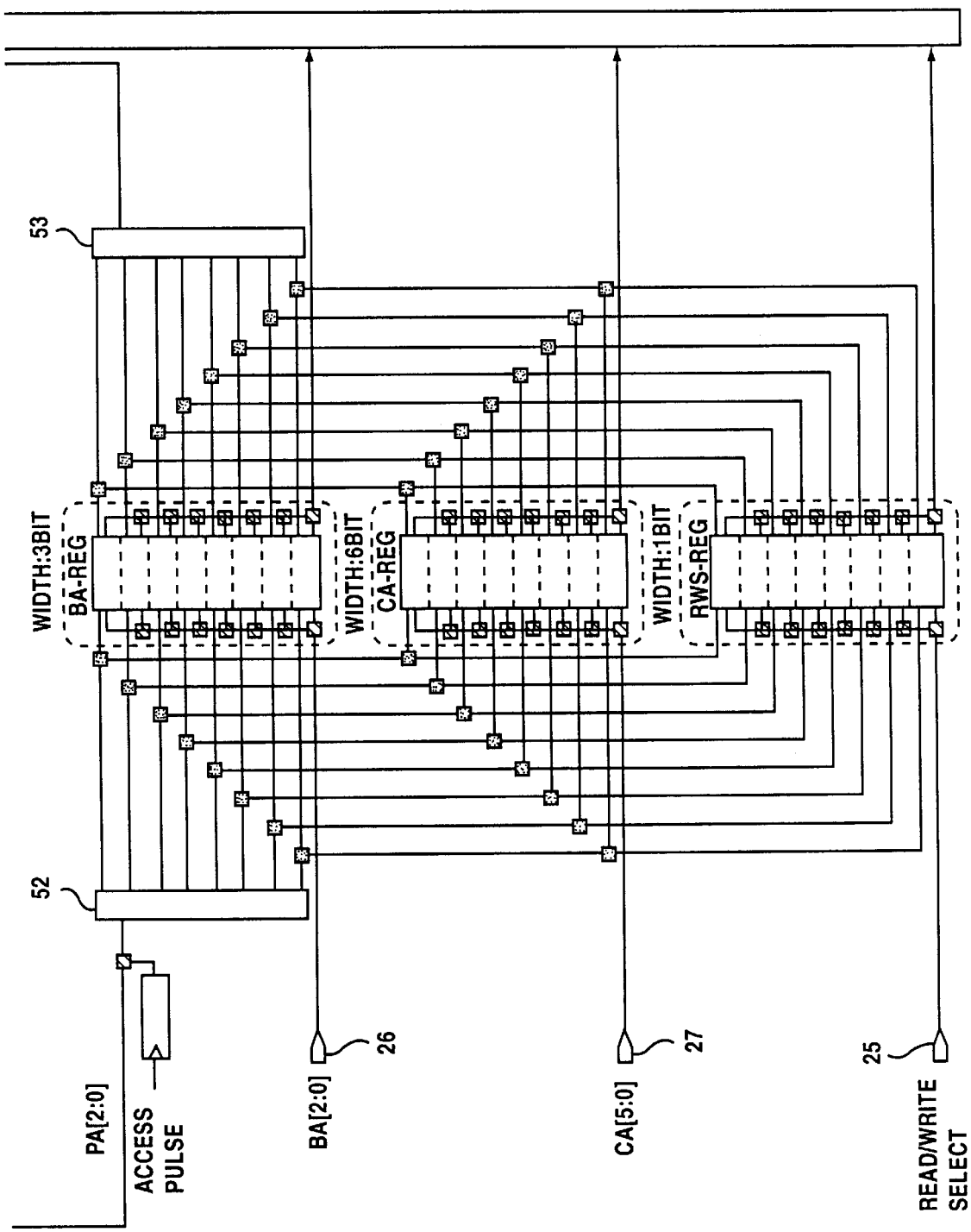
FIG. 7 is a diagram showing a scheduler of a second embodiment.

FIG. 7 is a diagram showing a scheduler of a second embodiment. The scheduler of FIG. 5 comprises 4 shift registers 21–24. However, a shift register that shifts right in synch with an edge of a clock clk, in itself, consumes a lot of current. Accordingly, the scheduler of the second embodiment employs a shift register configuration, wherein a shift register 21 for an internal operation command signal, which manages latency, performs a right shift operation at an edge of a clock clk similar to the first embodiment, but the holding circuit for control data, such as a bank address BA, column address CA and a read/write select signal, is configured using a plurality of registers, which do not shift right in accordance with a clock. Further, a shift register 50, which stores a pointer address and performs a right-shift operation is also provided.

That is, a bank address BA (26) is stored in 8 bank address registers BA-REG, a column address CA (27) is stored in 8 column address registers CA-REG, and a read/write select signal 25 is stored in register RWS-REG. The various registers possess various bit widths. These 8 registers are selected by input pointers pi0–pi7 and output pointers po0–po7 from an input pointer decoder 52 and an output pointer decoder 53. However, the input pointer decoder 52 and output pointer decoder 53 are supplied pointer addresses independently, and both pointers are controlled independently.

A counter 51 cyclically increments a count value in response to an access pulse from the packet decoder 1 when it distinguishes any one of the access commands, Bank-Read, Bank-Write, Page-Read or Page-Write. This count value is supplied to the input pointer decoder 52 as a pointer address PA2:0.

Initially, the pointer address PA is (000). When any of the access commands, Bank-Read, Bank-Write, Page-Read or Page-Write, are input in this state, the input pointer decoder 52 activates pointer pi0. In response to this, the bank address BA, column address CA and read/write select signal 25 which are control data inside a packet are latched to each $0^{th}$ register. At the same time as this, a pointer address PA is latched in response to a set signal SET from a latency control circuit 20 to a register of a pointer address shift register 50 at a location corresponding to the latency. Similar to the first embodiment, an H level is latched to a register of the column access shift register 21 at a location corresponding to the latency. And then, the counter 51 counts up by 1 the input pointer address.

Next, when an access command is input again, pointer pi1 is activated this time, and each control data inside the packet is latched to a $1^{st}$ register. Thereafter, input pointer addresses PA2:0 are counted up in order, and the control data in subsequent request packets is stored in each register.

Shift registers 21, 50 perform right-shift operations in synch with an edge of the clock clk. And then, after a number of clock clk pulses, which correspond to a latency set by the latency control circuit 20, the $0^{th}$ register of shift register 21 outputs a column access signal to the column control circuit 4, and the $0^{th}$ register of the pointer address shift register 50 also outputs a 3-bit pointer address corresponding thereto.

The output pointer decoder 53 is supplied with this pointer address, activates the corresponding pointer po0–po7, and outputs the stored bank address BA, column address CA and read/write select signal 25, respectively, to the column control circuit 4. The column control circuit 4 utilizes these control data to activate column circuitry and start an operation.

In the second embodiment, because the registers which store the bank address BA, column address CA, read/write select signal and other control data do not perform right-shift operations in synch with the clock clk, current consumption can be held down by that amount. However, a pointer address must be stored in shift register 50, and a right-shift operation must be performed.

In the second embodiment as well, shift registers 21, 50 can be configured using the master-slave flip-flop depicted in FIG. 6.

[Third and Fourth Embodiment]

Figure 8:
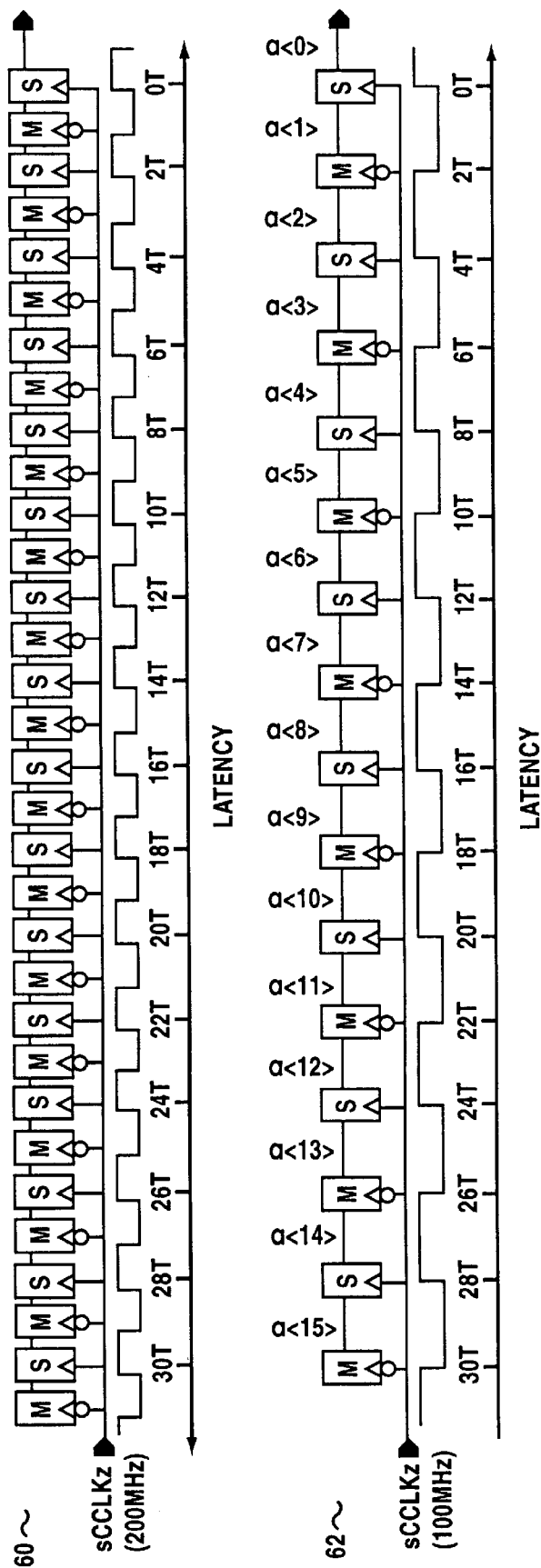
FIG. 8 is a diagram showing a shift register which uses a frequency-divided clock.

FIG. 8 is a diagram showing a shift register, which uses a frequency-divided clock for describing a third and fourth embodiment. The top shift register 60 is the same as the shift register depicted in FIG. 6. That is, the shift register 60 is a master-slave flip-flop, is configured to form 1 register unit, and shifts right in synch with a falling edge and a rising edge of a 200 MHz clock, which is the same as an external clock CLK. However, control data from outside, which is captured in response to a set signal, can only be captured from the master flip-flop side in synch with a falling edge of the clock. Therefore, the latency control unit is 2 ticks (2T) of the clock.

With the configuration of shift register 60, because a shift operation is performed at both edges of the clock, current consumption becomes great. Moreover, latency control is a 2T unit. Accordingly, the shift register 62 at the bottom of FIG. 8 halves the frequency of the external clock to 100 MHz, and treats the master flip-flop and the slave flip-flop each as 1 register unit. By so doing, it becomes possible to reduce the size of the circuit by half, to cut right-shift operations in half, and to significantly hold down on current consumption. That is, it becomes possible for external control data to be latched to the corresponding flip-flop (M or S), respectively, in response to a set signal. And a drive clock is generated by halving the frequency of the external clock.

However, with the configuration of shift register 62, it is not possible to cope with a situation wherein the input of a request packet commences from a rising edge of a frequency-divided clock, and with a situation wherein the input of a request packet commences from a falling edge of a frequency-divided clock.

That is, as shown in FIG. 4, a request packet starts at a rising edge of an external clock CLK. Then, subsequent to a prescribed latency, internal column circuitry is activated in synch with a rising edge of the external clock CLK. Therefore, in the case of the configuration of shift register 60, because a drive clock has the same frequency as the external clock CLK, data is outputted from the final stage of the slave flip-flop in synch with a rising edge of the external clock CLK.

Conversely, with the configuration of shift register 62, the drive clock is half the frequency of the external clock. Therefore, when the input of a request packet starts from a rising edge of the frequency-divided clock, an internal operation must start at a rising edge of the frequency-divided clock, and when the input of a request packet starts from a falling edge of the frequency-divided clock, an internal operation must start at a falling edge of the frequency-divided clock. For this reason, shift register 62 must output data from the final stage output node a <0> of the slave flip-flop S relative to packet input, which starts an internal operation from a rising edge of the frequency-divided clock (called the odd cycle). Furthermore, shift register 62 must output data from the final stage output node a <1> of the master flip-flop M relative to packet input, which starts an internal operation from a falling edge of the frequency-divided clock (called the even cycle).

Figure 9:
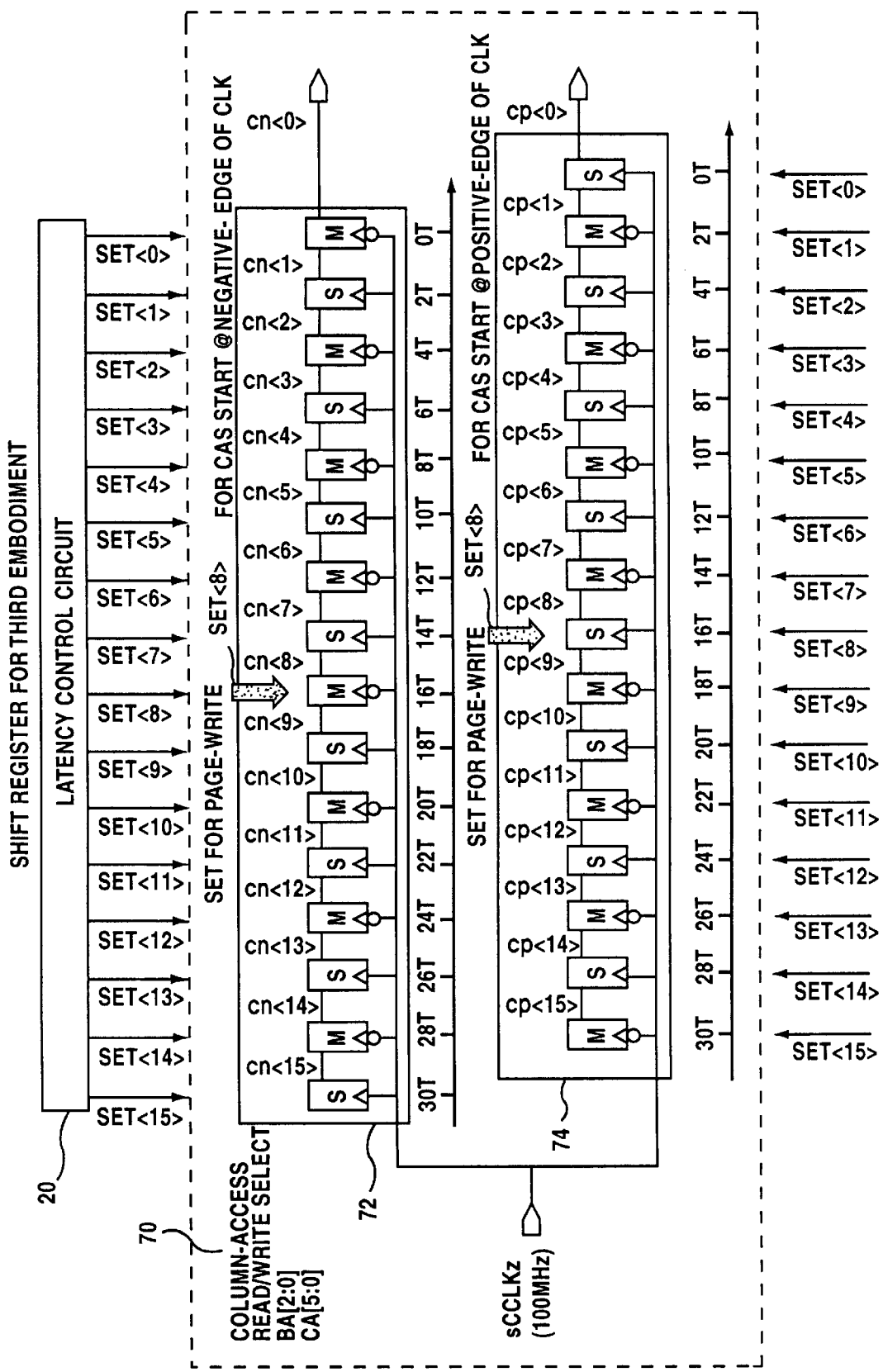
FIG. 9 is a diagram showing a scheduler shift register of a third embodiment.

FIG. 9 is a diagram showing a shift register, which is used in the scheduler of the third embodiment. The scheduler of the third embodiment comprises a configuration, wherein each shift register 21, 22, 23, 24 of the first embodiment of FIG. 5 is replaced by a shift register 70 capable of dealing with the odd cycle and even cycle shown in FIG. 9. Therefore, the shift register of FIG. 9 can be used as a shift register for column access, for a read/write select signal, for a bank address BA and for a column address CA.

Shift register 70 comprises an even cycle shift register 72, which starts an internal circuit operation at a falling edge of a frequency-divided clock sCCLKz, and an odd cycle shift register 74, which starts an internal circuit operation at a rising edge of a frequency-divided clock sCCLKz. The even cycle shift register 72 is a shift register, the first stage of which starts at a slave flip-flop S, and the final stage of which ends at a master flip-flop M, any of its master flip-flops M latch control data in synch with a falling edge of a frequency-divided drive clock, and subsequent to a prescribed latency, the final stage master flip-flop M outputs latched control data to node cn <0> in synch with a falling edge of the frequency-divided clock.

The odd cycle shift register 74 is a shift register, the first stage of which starts at a master flip-flop M, and the final stage of which ends at a slave flip-flop S, any of its slave flip-flops S latch control data in synch with a rising edge of a frequency-divided drive clock, and subsequent to a prescribed latency, the final stage slave flip-flop S outputs latched control data to node cp <0> in synch with a rising edge of the frequency-divided clock.

A set signal SET from a latency control circuit 20 is supplied to the even cycle shift register 72 with correspondence as shown in the upper part of the figure, and is supplied to the odd cycle shift register 74 with correspondence as shown in the lower part of the figure.

Accordingly, if described with the assumption that Page-Write is input as the access command, because Page-Write latency is 16 ticks (16T), the latency control circuit 20 activates set signal SET <8> to H level. Set signal SET <8> is supplied to a master flip-flop M relative to the even cycle shift register 72, and is supplied to a slave flip-flop S relative to the odd cycle shift register 74. Therefore, for an even cycle, a Page-Write column access signal is latched to the master flip-flop M, which is activated by set signal SET <8> in synch with a falling edge of the frequency-divided clock. And the right-shifted column access signal is outputted to node cn <0> from the final stage master flip-flop M in synch with a falling edge of the frequency-divided clock subsequent to a 16T latency. Therefore, activation of column circuitry starts from a falling edge of the frequency-divided clock.

Conversely, for an odd cycle, a Page-Write column access signal is latched to the slave flip-flop S, which is activated by set signal SET <8> in synch with a rising edge of the frequency-divided clock. And the right-shifted column access signal is outputted to node cp <0> from the final stage slave flip-flop S in synch with a rising edge of the frequency-divided clock subsequent to a 16T latency. Therefore, activation of column circuitry starts from a rising edge of the frequency-divided clock.

As described above, the latency control circuit 20 can simply make the latency-corresponding set signal SET H level at a timing that accords with the timing at which a request packet is inputted, and external data is latched to either the even cycle shift register 72 or the odd cycle shift register 74 in accordance with this timing, i.e. either a falling edge or a rising edge of the frequency-divided clock.

In the above-described third embodiment, the shift register must be provided in 2 systems, for even cycle and for odd cycle. Therefore, because circuit size doubles, it is not possible to reduce circuit size by half as shown in FIG. 8. However, since at least the frequency of the drive clock is halved, current consumption can be held down by that amount.

Figure 10B:
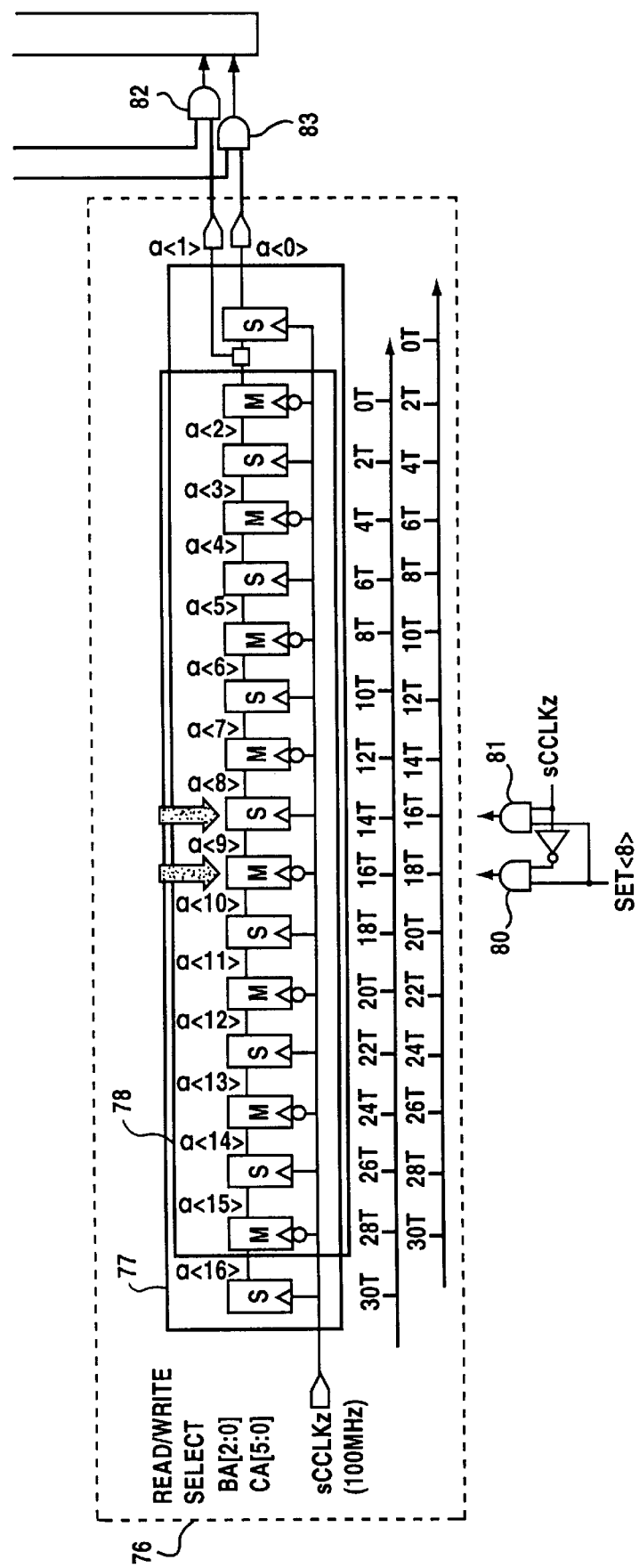
FIG. 10 is a diagram showing a scheduler shift register of a fourth embodiment.

FIG. 10 is a diagram showing a scheduler shift register of a fourth embodiment. In this embodiment, a column access shift register 70 is of the same configuration as the shift register shown in FIG. 9, and comprises an even cycle shift register 72 and an odd cycle shift register 74. Conversely, another shift register 76 is configured so that it starts with an initial stage slave flip-flop and ends with a final stage slave flip-flop. Then the location to which the set signal SET is provided is shifted depending on the even cycle and odd cycle. Shift register 76 stores control data, such as a read-write select signal, bank address BA and column address CA, and shifts right in synch with a frequency-divided clock cCCLKz.

Therefore, shift register 21 of the scheduler shown in FIG. 5 is replaced by shift register 70 in FIG. 10, and shift registers 22, 23, 24 of FIG. 5 are respectively replaced by shift register 76 of FIG. 10.

Accordingly, if we assume the command is Page-Write, the latency control circuit 20 activates set signal SET <8> to H level. When a request packet command CMD is input at a rising edge of a frequency-divided clock, a column access signal (H level) is latched to a slave flip-flop S of odd cycle shift register 74 in synch with a rising edge of the frequency-divided clock, and a read/write select signal, bank address, column address and other control data is latched to a slave flip-flop S of shift register set 78.

Then, subsequent to a 16 tick latency, the column access signal is outputted from output pin cn <0> of the final stage slave flip-flop S of shift register 74 in synch with a rising edge of the frequency-divided clock, and is supplied to a column control circuit 4. Further, control data is also supplied via AND gate 83 to the column control circuit 4 from output pin a <0> of the final stage slave flip-flop of flip-flop 78.

Conversely, when a request packet command CMD is input at a falling edge of the frequency-divided clock, a column access signal (H level) is latched to a master flip-flop M of even cycle shift register 72 in synch with a falling edge of the frequency-divided clock, and a read/write select signal, bank address, column address and other control data is latched to a master flip-flop M of shift register set 77.

Then, subsequent to a 16 tick latency, the column access signal is outputted from output pin cp <0> of the final stage master flip-flop M of shift register 72 in synch with a falling edge of the frequency-divided clock, and is supplied to the column control circuit 4. Further, control data is also supplied via AND gate 82 to the column control circuit 4 from output pin a <1> of the final stage master flip-flop of flip-flop 77.

In the above-described fourth embodiment, because only a column access shift register 70 is provided as a 2 system even and odd shift register, circuit size can be made smaller than the third embodiment.

As a fifth embodiment, the size of the shift register circuit can be held to the minimum by substituting a shift register 70 comprising an even cycle and an odd cycle shift register as in FIG. 10 for the column access shift register 21 of the scheduler of the second embodiment shown in FIG. 7, and by substituting shift register 76 of FIG. 10 for a pointer address shift register 50. Moreover, because the drive clock becomes a frequency-divided clock in this case, the frequency of shift register right-shift operations is halved, and current consumption can also be held down.

The preceding embodiments have described examples of column circuitry activation operations as internal circuit operations. However, this is not only a column circuitry activation scheduler, but can also be used as a scheduler, which manages the timing of precharge circuit activation in an auto-precharge operation, for example.

As described above, in accordance with the present invention, when an internal circuit operation starts subsequent to a prescribed latency following the receipt of a packet signal that includes a command, it is possible to provide a clock-synchronized memory device, such as a SyncLink DRAM, with a scheduler which manages latency up until the start of that internal operation. Therefore, a memory controller need only supply a command, and required control data, such as a bank address, row address, column address, one time, thus enabling the load on the memory controller to be lessened.

Further, the scheduler of the present invention comprises a shift register, which stores a timing signal of an internal circuit operation start. And the scheduler is capable of supplying an internal operation command to a controlled circuit subsequent to a number of ticks of a clock, which correspond to latency, by a latency control circuit simply storing an internal operation command signal, which directs the start of an internal operation, in the shift register at a location, which corresponds to optimum latency in accord with a command or an initial setting value. Moreover, it is capable of coping with a change in latency accompanying a change in an initial setting value by simply changing the location of the storage register within the shift register, thus enhancing flexibility.

In accordance with the present invention, because schedule management is possible for a Page-Read and Page-Write command in addition to Bank-Read, Bank-Write commands, by using these modes, after Bank-Read, it is possible to consecutively read memory data with different row addresses by simply providing a request packet, which includes a different bank address and a Page-Read command. And after a Bank-Write, it is also possible to consecutively write data to memory with different row addresses by simply providing a request packet, which includes a different bank address and a Page-Write command.

What is claimed is:

1. A scheduler, which generates an internal operation command signal that directs the operation of an internal circuit subsequent to a latency, which is defined by a supplied command or an initial value, said scheduler comprising:

a shift register, which stores said internal operation command signal, and performs a shift operation in synch with a clock; and a latency control circuit, which stores the internal operation command signal in a selected register of the shift register, said selected register being at a stage in said shift register which requires shifting by a number of clock pulses which corresponds to the latency;

wherein an internal operation command signal, which is outputted from a final stage of said shift register subsequent to the number of clock pulses corresponding to said latency, is supplied to the internal circuit.

2. The scheduler according to claim 1, further comprising:

a control data holding circuit, which holds control data required for the operation of said internal circuit, said control data being supplied to said internal circuit subsequent to the number of clock pulses corresponding to said latency.

3. The scheduler according to claim 2, wherein:

said control data holding circuit comprises a control data shift register, which stores said control data, and which performs a shift operation in synch with said clock, and said control data is stored in a register at a location selected by said latency control circuit, and subsequent to the number of clock pulses corresponding to said latency, said control data is outputted from the final stage of said control data shift register and supplied to said internal circuit.

4. The scheduler according to claim 2, wherein:

said control data holding circuit comprises a plurality of control data registers, which sequentially store said control data, and a pointer address shift register, which stores a pointer address of a register in the control data registers in which said control data is stored, and which performs shift operations in synch with said clock, and said pointer address is stored in a register at a location selected by said latency control circuit, and subsequent to the number of clock pulses corresponding to said latency, said pointer address is outputted from the final stage of said pointer address shift register, and control data inside said control data register, which corresponds to this outputted pointer address, is supplied to said internal circuit.

5. The scheduler according to claim 1, wherein:

said shift register is driven by a frequency-divided clock that divides an external clock by frequency, and said shift register comprises: a first even cycle shift register, a final stage register of which outputs a stored signal in synch with a falling edge of said frequency-divided clock; and a first odd cycle shift register, a final stage register of which outputs a stored signal in synch with a rising edge of said frequency-divided clock, and said latency control circuit, in synch with a falling edge of said frequency-divided clock, stores said internal operation command signal in a register of said first even cycle shift register at a stage which requires shifting by the number of clock pulses corresponding to said latency, and in synch with a rising edge of said frequency-divided clock, stores said internal operation command signal in a register of said first odd cycle shift register at a stage which requires shifting by the number of clock pulses corresponding to said latency.

6. The scheduler according to claim 5, further comprising:

a control data holding circuit, which stores control data required for the operation of said internal circuit, and said control data is supplied to said internal circuit subsequent to the number of clock pulses corresponding to said latency.

7. The scheduler according to claim 6, wherein:

said control data holding circuit comprises a control data shift register, which shifts said stored control data in synch with said frequency-divided clock, and said control data is stored in a register at a location selected by said latency control circuit, and subsequent to a number of frequency-divided clock pulses corresponding to said latency, said control data is outputted from the final stage of said control data shift register and supplied to said internal circuit; and the control data shift register comprises: a second even cycle shift register, the final stage register of which outputs stored control data in synch with a falling edge of said frequency-divided clock; and a second odd cycle shift register, the final stage register of which outputs stored control data in synch with a rising edge of said frequency-divided clock; and said latency control circuit, in synch with a falling edge of said frequency-divided clock, stores said control data in a register of said second even cycle shift register at a stage which requires shifting by the number of clock pulses corresponding to said latency, and in synch with a rising edge of said frequency-divided clock, stores said control data in a register of said second odd cycle shift register at a stage which requires shifting by the number of clock pulses corresponding to said latency.

8. The scheduler according to claim 6, wherein:

said control data holding circuit comprises a control data shift register, which shifts said stored control data in synch with said frequency-divided clock, and said control data is stored in a register at a location selected by said latency control circuit, and subsequent to a number of frequency-divided clock pulses corresponding to said latency, said control data is outputted from the final stage of said control data shift register and supplied to said internal circuit; and said control data shift register comprises: an even output pin, which outputs stored control data in synch with a falling edge of said frequency-divided clock; and an odd output pin, which outputs stored control data in synch with rising edge of said frequency-divided clock.

9. A memory device, said memory device comprising a scheduler, which generates an internal operation command signal that directs the operation of an internal circuit subsequent to a latency, which is defined by a supplied command or an initial value, said scheduler of said memory device comprising:

a shift register, which stores said internal operation command signal, and performs a shift operation in synch with a clock; and a latency control circuit, which stores the internal operation command signal in a selected register of the shift register, said selected register being at a stage in said shift register which requires shifting by a number of clock pulses which corresponds to the latency;

wherein an internal operation command signal, which is outputted from a final stage of said shift register subsequent to the number of clock pulses corresponding to said latency, is supplied to the internal circuit.

10. The memory device according to claim 9, further comprising:

a memory cell array; and column circuitry corresponding to said memory cell array;

wherein said internal operation command signal is a column access signal, said latency is the delay time after a command is supplied until said column circuitry starts an operation, and, said column circuitry starts an operation in response to the column access signal outputted from the final stage of said shift register.

11. A memory device, to which is supplied a command, together with a row address and a column address, in synch with an external clock, said memory device comprising:

a memory cell array, said memory cell array including internal column circuitry, which operates in response to said column address; and a scheduler, which supplies to said internal column circuitry a column access signal so as to start an operation of said internal column circuitry subsequent to a latency corresponding to the supplied command after said command is supplied.

12. The memory device according to claim 11, further comprising:

a mode register, in which is stored an initial value for an internal operation, wherein said scheduler changes latency in accordance with said initial value.

13. The memory device according to claims 11 or 12, wherein:

said scheduler comprises a shift register, which stores said column access signal, and shifts the column access signal in synch with a clock; and a latency control circuit, which stores said column access signal in a register of said shift register at a location corresponding to said latency;

wherein the column access signal, which is outputted from the final stage of said shift register, is supplied to said internal column circuitry, subsequent to a number of clock pulses corresponding to said latency.

14. A memory device, to which a request packet signal including a command, a bank address and a column address is supplied in synch with an external clock, said memory device comprising:

a plurality of memory banks, each including a memory cell array;

internal column circuitry associated with each memory bank of said plurality of memory banks, operates in correspondence with said column address and bank address, and effectuates access to a memory bank, which corresponds to said bank address; and a scheduler, which supplies to said internal column circuitry, together with said bank address and column address, a column access signal, which starts an operation of said internal column circuitry, subsequent to latency corresponding to the supplied command after the command is supplied, wherein in response to request packet signals including different bank address, different memory banks corresponding to the different bank address is accessed.

* * * * *